(12) United States Patent
Maekawa

(10) Patent No.: US 9,324,573 B2
(45) Date of Patent: Apr. 26, 2016

(54) METHOD FOR MANUFACTURING SEMICONDUCTOR DEVICE

(71) Applicant: PS5 Luxco S.a.r.l., Luxembourg (LU)

(72) Inventor: Atsushi Maekawa, Tokyo (JP)

(73) Assignee: PS5 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/762,699

(22) PCT Filed: Jan. 17, 2014

(86) PCT No.: PCT/JP2014/050744
§ 371 (c)(1),
(2) Date: Jul. 22, 2015

(87) PCT Pub. No.: WO2014/115641
PCT Pub. Date: Jul. 31, 2014

(65) Prior Publication Data
US 2015/0325454 A1    Nov. 12, 2015

(30) Foreign Application Priority Data

Jan. 24, 2013    (JP) .................................. 2013-010846

(51) Int. Cl.
| | |
|---|---|
| H01L 21/311 | (2006.01) |
| H01L 27/108 | (2006.01) |
| H01L 21/02 | (2006.01) |
| H01L 21/3105 | (2006.01) |
| H01L 21/768 | (2006.01) |

(52) U.S. Cl.
CPC ...... *H01L 21/31116* (2013.01); *H01L 21/0217* (2013.01); *H01L 21/02115* (2013.01); *H01L 21/02164* (2013.01); *H01L 21/02274* (2013.01); *H01L 21/3105* (2013.01); *H01L 21/31144* (2013.01); *H01L 27/10844* (2013.01); *H01L 27/10894* (2013.01); *H01L 21/31138* (2013.01); *H01L 21/76816* (2013.01)

(58) Field of Classification Search
None
See application file for complete search history.

(56) References Cited

U.S. PATENT DOCUMENTS

| | | | | |
|---|---|---|---|---|
| 6,100,132 A | * | 8/2000 | Sato | ..................... H01L 27/1087 257/E21.013 |
| 6,794,259 B2 | * | 9/2004 | Lichter | ............... H01L 21/3086 257/E21.235 |
| 7,615,816 B2 | * | 11/2009 | Cheng | ............... H01L 27/10864 257/301 |

(Continued)

FOREIGN PATENT DOCUMENTS

| | | |
|---|---|---|
| JP | 2000357736 | 12/2000 |
| JP | 2013191674 | 9/2013 |

OTHER PUBLICATIONS

Application No. PCT/JP2014/050744, International Search Report, Mar. 25, 2014.

*Primary Examiner* — Evren Seven
(74) *Attorney, Agent, or Firm* — Kunzler Law Group

(57) ABSTRACT

One method includes sequentially forming an insulating film and a first material film on a semiconductor substrate, forming on the first material film a mask film having a rectangular first opening, and dry-etching the first material film using the mask film as a mask to form an ellipsoidal second opening having its shorter side aligned in a first direction of the first material film. Forming the mask film includes forming a second material film having a side surface that faces the first direction of the first opening, and a third material film having side surfaces facing a second direction of the first opening, and the thickness of the third material film is greater than the thickness of the second material film.

22 Claims, 11 Drawing Sheets

(56) References Cited

U.S. PATENT DOCUMENTS

| | | | |
|---|---|---|---|
| 2006/0255386 A1* | 11/2006 | Ueda | H01L 21/31116 257/296 |
| 2007/0040224 A1* | 2/2007 | Green | H01L 21/31111 257/368 |
| 2007/0182017 A1 | 8/2007 | Park | |
| 2008/0045034 A1* | 2/2008 | Shea | H01L 21/31116 438/738 |
| 2008/0185680 A1* | 8/2008 | Cheng | H01L 29/66181 257/532 |
| 2009/0045165 A1 | 2/2009 | Narishige et al. | |
| 2009/0179004 A1 | 7/2009 | Kajiwara | |
| 2009/0184356 A1* | 7/2009 | Brodsky | H01L 21/84 257/301 |
| 2013/0171821 A1* | 7/2013 | Kim | H01L 21/76877 438/675 |
| 2015/0145009 A1* | 5/2015 | Namioka | H01L 27/10814 257/296 |

\* cited by examiner

Figure 3
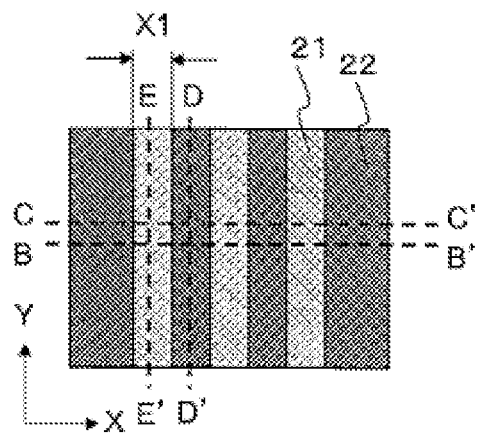
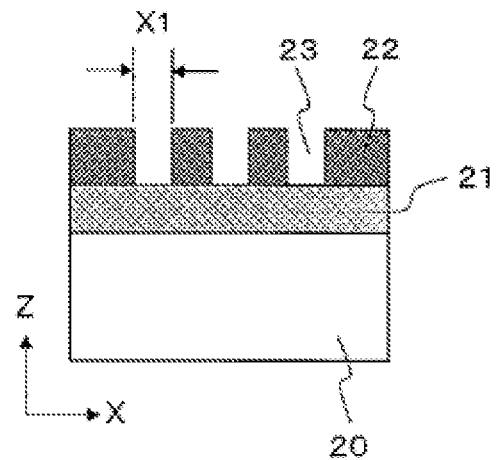

Figure 6
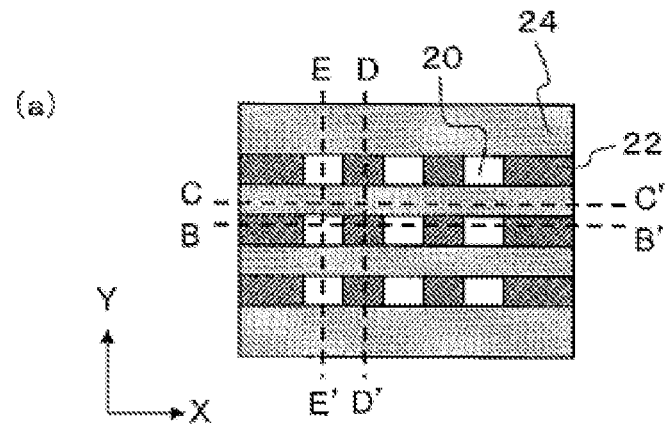
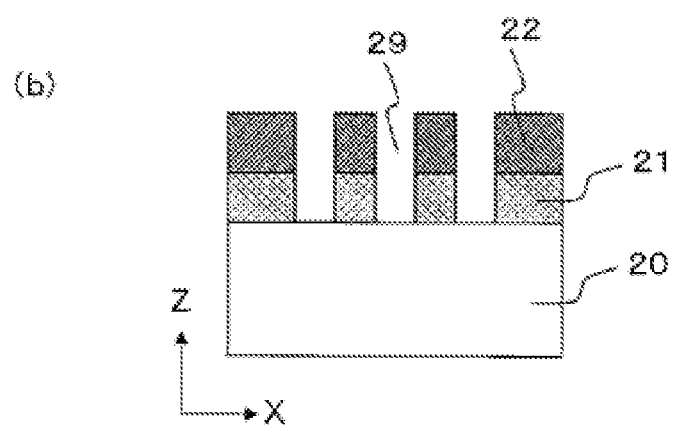
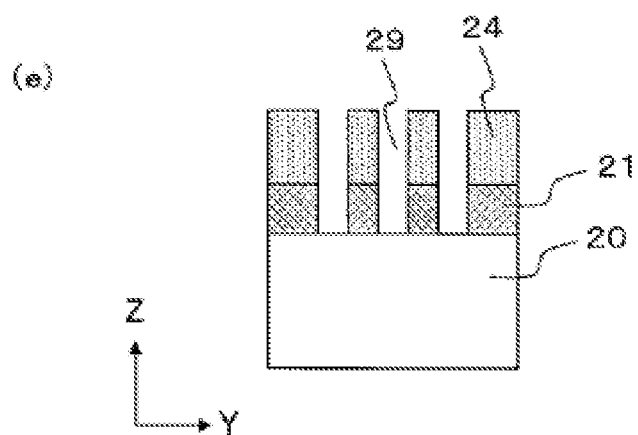

Figure 7
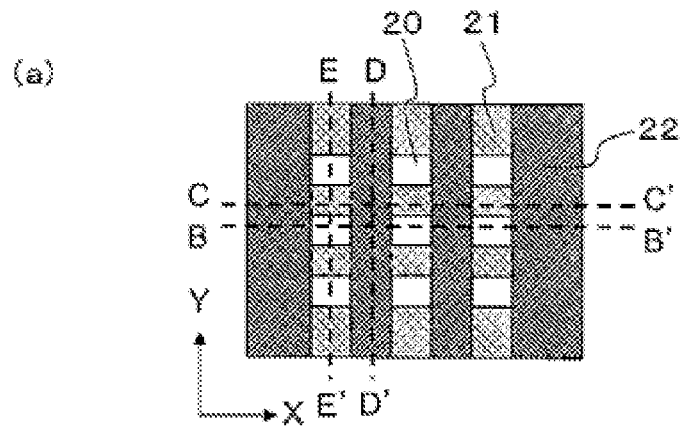
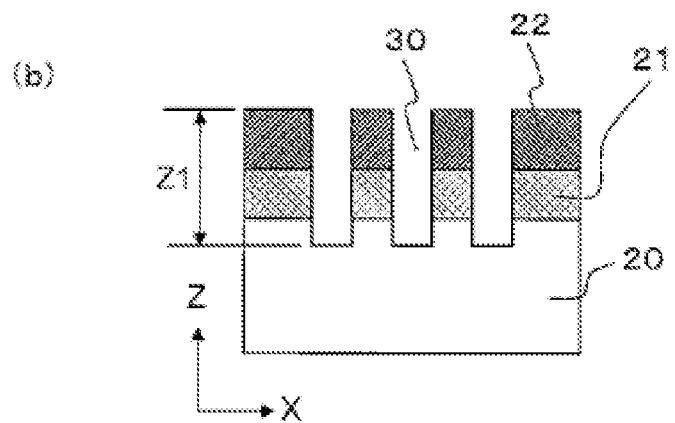
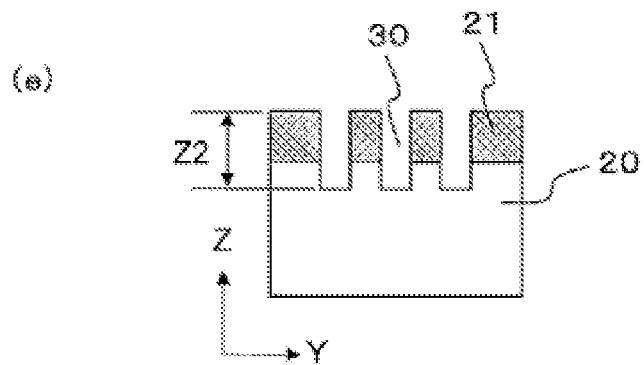

METHOD FOR MANUFACTURING SEMICONDUCTOR DEVICE

TECHNICAL FIELD

The present invention relates to a method of manufacturing a semiconductor device.

BACKGROUND ART

As the density of semiconductor devices, typified by DRAMs (Dynamic Random Access Memory) and the like, has increased, it has become desirable to form holes having a high aspect ratio (hereinafter referred to as high-aspect holes) in interlayer insulating films such as silicon dioxide films which form the semiconductor device.

If the layout of the DRAM cells allows cylinder holes for capacitors to have a close-packed arrangement, it is preferable for the planar shape of the cylinder holes to be circular, but if a close-packed arrangement is problematic, the planar shape is preferably elliptical.

However, high-aspect holes are formed by dry etching using a hardmask, and in order to obtain a required etching selectivity to cope with increasing aspect ratios, there is a tendency for hardmasks to be multi-layered. With such a multi-layered hardmask, an elliptical pattern is formed on the uppermost layer by photolithography, using a reticle provided with an elliptical pattern, but there is a problem in that when the pattern is then repeatedly process-transferred from an upper layer portion to a lower layer portion of the hardmask, the ellipticity (the ratio of the major diameter to the minor diameter) of the pattern gradually decreases as a result of a reduction in the processing accuracy, and when the hardmask is completed, the pattern is substantially circular, and it is not possible to form the required elliptical hole.

Meanwhile, Japanese Patent Kokai 2010-272714 (patent literature article 1) discloses a method of forming a capacitor using double-patterning in order prevent a deterioration in the accuracy of the pattern transfer attributable to the characteristics of lithography.

More specifically, patent literature article 1 discloses a method of forming a columnar capacitor using double-patterning, including: a step of forming an insulating film on a semiconductor substrate; a step of forming on the insulating film a first mask having a strip-shaped pattern extending in a first direction; a step of forming a strip-shaped body by processing the insulating film into a strip-shaped body by etching the insulating film using the first mask as a mask; a step of forming on the strip-shaped body a second mask having a strip-shaped pattern extending in a second direction that is different from the first direction; and a step of forming a columnar body by processing the strip-shaped body into a columnar body by etching the strip-shaped body using the second mask as a mask.

However, with columnar capacitors, capacitors can only be formed on the columnar side surfaces, and since the capacitance is therefore small, they cannot be employed in miniaturized semiconductor devices. Capacitors used in miniaturized semiconductor devices must therefore have a crown structure, in which the inner and outer surfaces of a lower electrode are used as capacitors. In this case, cylinder holes, on the inner surfaces of which lower electrodes are formed, must be formed in the insulating film. Further, it is desirable for the planar shape of the cylinder hole to be formed as an ellipse.

PATENT LITERATURE

Patent literature article 1: Japanese Patent Kokai 2010-272714

SUMMARY OF THE INVENTION

Problems to be Resolved by the Invention

The present invention resolves the problems in the above-mentioned prior art, and provides a method of manufacturing a semiconductor device, capable of accurately making cylinder holes elliptical.

Means of Overcoming the Problems

A method of manufacturing a semiconductor device according to one aspect of the present invention is characterized in that it comprises:
a step of successively forming an insulating film and a first material film on a semiconductor substrate;
a step of forming on the first material film a masking film having a rectangular first opening; and
a step of dry-etching the first material film using the masking film as a mask to form, in the first material film, an elliptical second opening having a short edge in a first direction;
wherein
the step of forming the masking film comprises a step of forming a second material film having side surfaces that face one another in a first direction of the first opening, and a third material film having side surfaces that face one another in a second direction of the first opening, and
the thickness of the third material film is greater than the thickness of the second material film.

Further, a method of manufacturing a semiconductor device according to another aspect of the present invention is characterized in that it comprises:
a step of successively forming an insulating film, a first masking film, a second masking film and a third masking film on a semiconductor substrate;
a step of forming, on the first masking film, a first opening which is rectangular as seen in a plan view and which has two side surfaces comprising the second masking film, facing one another in a first direction, and two side surfaces comprising the second masking film and the third masking film, facing one another in a second direction perpendicular to the first direction;
a step of dry etching the first masking film that is exposed in the first opening, to form in the first masking film a second opening which is elliptical as seen in a plan view; and
a step of dry etching the insulating film, using as a mask the first masking film in which the second opening has been formed, to form in the insulating film a hole that is elliptical as seen in a plan view.

Advantages of the Invention

According to the present invention, a cylinder hole can be accurately made to be elliptical.

BRIEF EXPLANATION OF THE DRAWINGS

FIG. 3 is a drawing used to describe a method of forming a pattern in the hardmask (a step of forming a second part mask).

FIG. 6 is a drawing used to describe a method of forming a pattern in the hardmask (a step of forming the first part mask).

FIG. 7 is a drawing used to describe a method of forming a pattern in the hardmask (a step of forming the first part mask).

MODES OF EMBODYING THE INVENTION

Preferred modes of embodiment of the present invention will now be described in detail with reference to the drawings.

A semiconductor device to which the present invention is applicable will be described with reference to FIG. 1, taking a DRAM as an example. Here, FIG. 1 (*a*) is a plan view of a DRAM 100, and FIG. 1 (*b*) is a cross-sectional view through A-A' in FIG. 1 (*a*). It should be noted that the description mainly refers to FIG. 1 (*b*), supplemented with FIG. 1 (*a*) as necessary.

Figure 1:
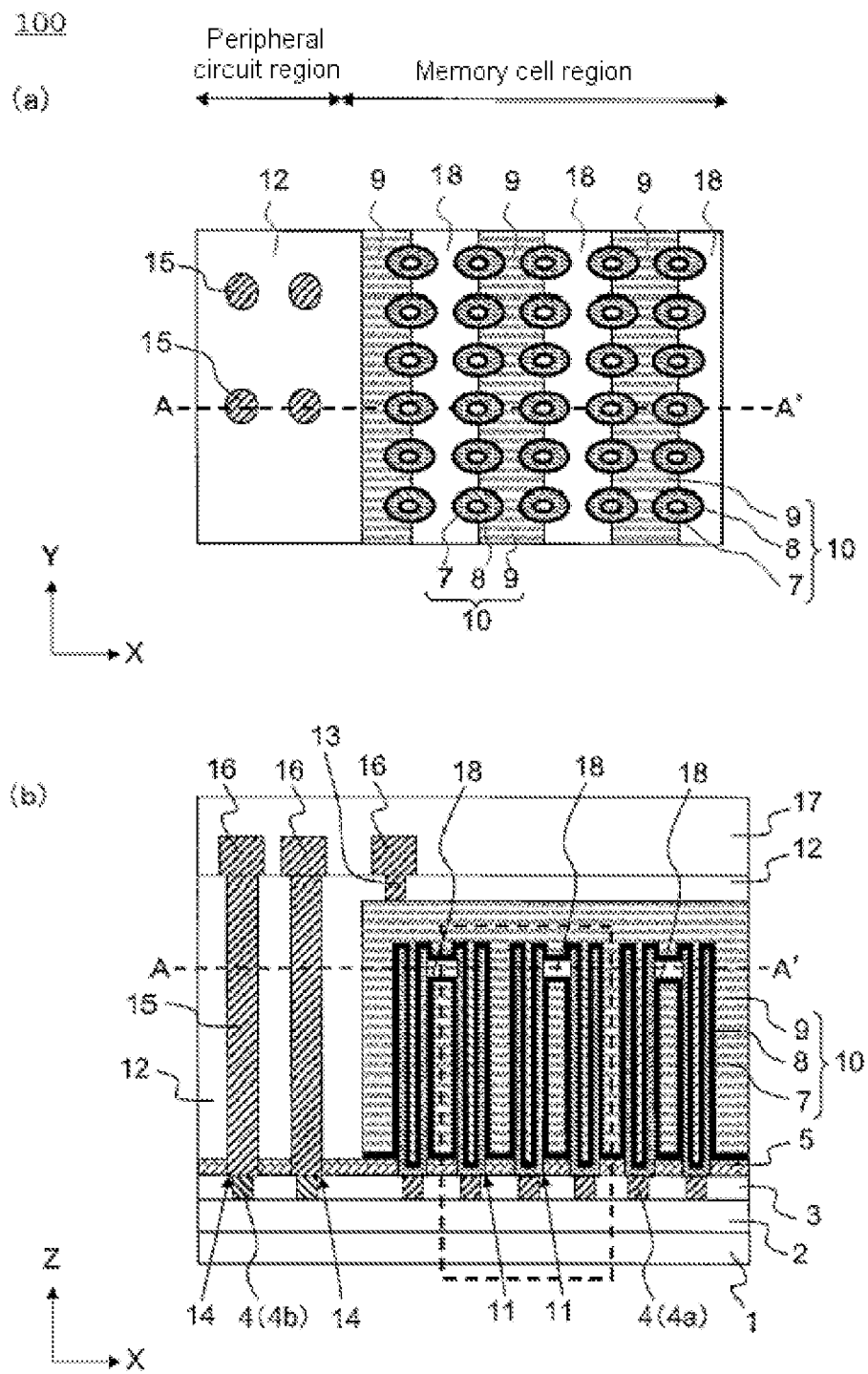
FIG. 1 is a drawing illustrating a semiconductor device (DRAM) to which the present invention is applicable, where (a) is a plan view and (b) is a cross-sectional view through A-A' in (a).

As illustrated in FIG. 1, a memory cell region in which memory cells are disposed, and a peripheral circuit region for driving the memory cells are provided in a semiconductor substrate 1 (referred to hereinafter as a silicon substrate 1). Pairs of impurity-diffused regions are disposed in active regions demarcated by element isolation regions, in an upper portion of the silicon substrate 1 in the memory cell region, and a gate insulating film and a gate electrode are stacked on one another on the upper surface of the silicon substrate 1, thereby forming MOS (Metal Oxide Semiconductor) transistors (which are not shown in the drawings).

The MOS transistors are covered by an interlayer insulating film 2 provided on the upper surface of the silicon substrate 1, and bit lines (which are not shown in the drawings) are provided on the upper surface of the interlayer insulating film 2 and are each connected to one of the impurity-diffused regions by way of first contact plugs (which are not shown in the drawings), which penetrate through the interlayer insulating film 2. The interlayer insulating film 2 and the bit lines are covered by an interlayer insulating film 3, and contact plugs 4 (4*a*) which penetrate through the interlayer insulating film 3 are connected to the other impurity-diffused regions by way of first contact plugs that are different from those described hereinabove.

A stopper film 5 and lower electrodes 7 are provided on the upper surface of the interlayer insulating film 3 in such a way as to cover the contact plugs 4. To describe this in more detail, cylinder holes (high-aspect holes) 11 are provided penetrating through the stopper film 5 in the memory cell region and the interlayer insulating film located on the upper surface of the stopper film 5, and the crown-shaped lower electrodes 7 are provided on the inner walls of the cylinder holes 11. Here, the locations of the inner walls of the cylinder holes 11 correspond to the outer wall surfaces of the lower electrodes 7. As illustrated in FIG. 1 (*a*), the planar shape of the cylinder holes 11 is an ellipse having its short edge in the Y-direction (first direction).

The bottom surface portions of the lower electrodes 7 are connected to the upper surfaces of the contact plugs 4 (4*a*), and portions of the side surfaces are connected to support films 18. It should be noted that the support films 18 fulfill the role of supporting adjacent pairs of lower electrodes 7 in such a way that they do not come into contact with one another. The inside and outside surface portions and the upper surface portions of the lower electrodes 7 are covered by a capacitative insulating film 8 and an upper electrode 9. This configuration thus makes it possible to obtain approximately twice the capacitance of the columnar capacitor described in patent literature article 1.

Capacitors 10 are formed from the lower electrodes 7, the insulating films 8 and the upper electrode 9 disposed as described hereinabove. Further, as illustrated in FIG. 1 (*a*), the capacitors 10 are disposed in the memory cell region, aligned in the Y-direction and the X-direction (second direction) perpendicular to the Y-direction, and disposed equally spaced and with equal pitch spacings in both directions. Further, the support films 18, which extend in the Y-direction, are connected to the side surfaces of portions of the lower electrodes 7 disposed in the Y-direction. It should be noted that the insides of the lower electrodes 7 are covered by the upper electrode 9, as illustrated in the drawings. An interlayer insulating film 12 is provided in such a way as to cover the upper electrode 9, and a contact plug 13 which penetrates through the interlayer insulating film 12 is connected to the upper electrode 9.

Similarly, above the silicon substrate 1 in the peripheral circuit region, contact plugs 15 are provided in cylinder holes 14 which penetrate through the interlayer insulating film 12, and the contact plugs 15 are connected to the contact plugs 4 (4*b*). Wiring lines 16 are disposed on the upper surface of the interlayer insulating film 12 and are connected to the contact plugs 15, the wiring line 16 in the memory cell region being connected to the contact plug 13. Further, the wiring lines 16 in each area are covered by an interlayer insulating film 17.

As discussed hereinabove, an increase in the capacitance of the memory cells in the DRAM 100 is achieved by providing the capacitors 10 in the cylinder holes 11, the occupied surface area of which is made as large as possible by adopting an elliptical shape.

In the DRAM 100 configured as described hereinabove, the method of manufacturing the semiconductor device according to the present invention is employed in the process of manufacturing the cylinder holes 11, and therefore a method of manufacturing the cylinder holes 11 will now be described with reference to FIG. 2 to FIG. 11.

A method of manufacturing a hardmask 200 used to form the cylinder holes 11 will first be described with reference to FIG. 2. A method of forming a pattern in the hardmask 200 will then be described with reference to FIG. 3 to FIG. 9. Finally a method of forming the cylinder holes 11 will be described with reference to FIG. 10 and FIG. 11.

Figure 2:
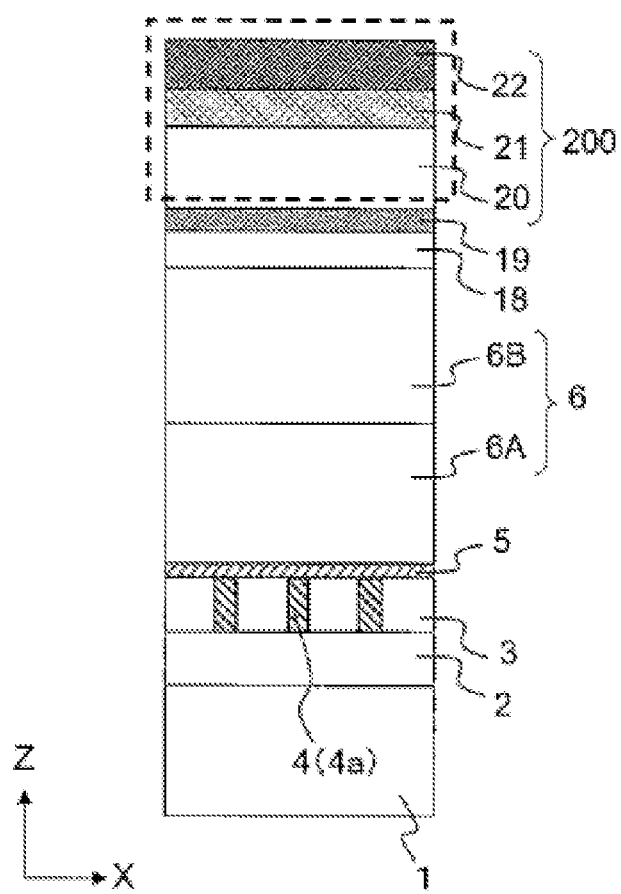
FIG. 2 is a cross-sectional view in which a hardmask has been formed above a silicon substrate in a step of forming a capacitor, being a drawing in which the portion indicated by the dashed lines in FIG. 1 (*b*) has been extracted.

Reference is first made to FIG. 2. FIG. 2 is a cross-sectional view in which the hardmask 200 has been formed above the silicon substrate 1 in the step of forming the capacitors 10, illustrating in extract the portion indicated by the dashed lines in FIG. 1 (*b*).

Although not depicted here, MOS transistors having a gate insulating film and a gate electrode, and a pair of impurity-diffused layers which form the source and the drain, are formed in the silicon substrate 1 by a known method. Further, the interlayer insulating film 2 covering the MOS transistors, the first contact plugs (which are not shown in the drawings) which penetrate through the interlayer insulating film 2 and are connected to the impurity-diffused layers, the bit lines (which are not shown in the drawings) disposed on the upper surfaces of a portion of the first contact plugs, the interlayer insulating film 3 covering the bit lines, and the contact plugs 4 (4a) which penetrate through the interlayer insulating film 3 and are connected to the upper surfaces of the first contact plugs are respectively formed by known methods.

Next, the stopper film 5, which is a silicon nitride film (SiN) having a thickness of 30 nm, is deposited by ALD (Atomic Layer Deposition) in such a way as to cover the upper surfaces of the interlayer insulating film 3 and the contact plugs 4.

An interlayer insulating film 6 is then formed in such a way as to cover the stopper film 5. The interlayer insulating film 6 may comprise a single layer, but here an interlayer insulating film 6A comprising BPSG (Boron Phospho Silicate Glass) having a thickness of 500 nm is deposited by thermal CVD, after which an interlayer insulating film 6B comprising NSG (Non-doped Silicate Glass) having a thickness of 550 nm is laminated thereon by being deposited in the same way, to form a multilayer structure.

Next, a support film 18, which is a silicon nitride film having a thickness of 100 nm, is deposited by ALD in such a way as to cover the upper surface of the interlayer insulating film 6B which forms the upper layer of the interlayer insulating film 6.

An interlayer insulating film 19, which is a silicon dioxide film ($SiO_2$) having a thickness of 60 nm, is then deposited by plasma CVD in such a way as to cover the upper surface of the support film 18.

The stopper film 5, the interlayer insulating film 6 (6A, 6B), the support film 18 and the interlayer insulating film 19 are the target films in which the cylinder holes 11 are to be formed.

A first masking film 20, which is an amorphous carbon film (hereinafter referred to as an AC film.) having a thickness of 500 nm, a second masking film 21, which is a silicon nitride film having a thickness of 30 nm, and a third masking film 22, which is a silicon dioxide film having a thickness of 50 nm, are then deposited successively by plasma CVD in such a way as to cover the upper surface of the interlayer insulating film 19.

The second masking film 21 forms a first part mask for the first masking film 20, and the third masking film 22 forms a second part mask for the first masking film 20. Further, the first masking film 20 is the final mask for forming the high-aspect holes 11 in the target films. Hereinafter, the first masking film 20, the second masking film 21 and the third masking film 22 are sometimes referred to collectively as the hardmask 200.

A method of forming a pattern in the hardmask 200 will now be described with reference to FIG. 3 to FIG. 8, in which the portion indicated by the dashed lines in FIG. 2 has been extracted. It should be noted that in FIG. 3 to FIG. 8, (a) is a plan view, (b) is a cross-sectional view through B-B' in (a), (c) is a cross-sectional view through C-C' in (a), (d) is a cross-sectional view through D-D' in (a), and (e) is a cross-sectional view through E-E' in (a). It should be noted that the description mainly refers to (a) and (b) or (a) and (d), supplemented with the other cross-sectional views as necessary.

Reference is first made to FIG. 3. It should be noted that the step described in FIG. 3 refers to the step of forming the second part mask.

First opening portions 23, the width X1 of which in the X-direction is 40 nm and which extend in the Y-direction, are formed in the third masking film 22 by photolithography and dry etching. Here, portions of the second masking film 21 are exposed at the bottom surface of the first opening portions 23.

Figure 4:
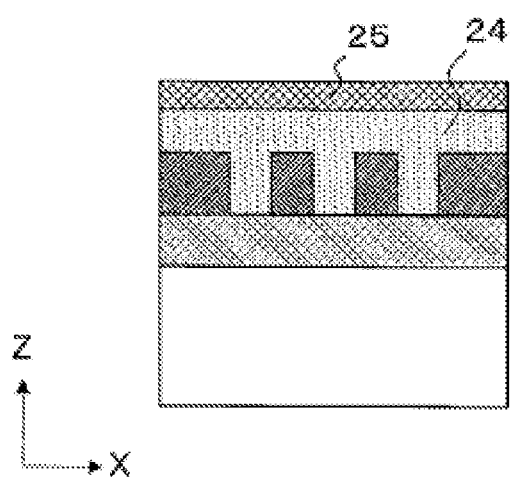
FIG. 4 is a drawing used to describe a method of forming a pattern in the hardmask (a step of forming a first part mask).

Reference is now made to FIG. 4. It should be noted that the step described in FIG. 4 to FIG. 7 refers to the step of forming the first part mask.

A first organic coating film 24, which is an antireflective film (BARC: Bottom Anti Reflective Coating), is deposited by spin coating in such a way as to fill the first opening portions 23. The first organic coating film 24 is flowable and spreads out, and therefore even though it fills the first opening portions 23, which are recessed portions, the upper surface of the first organic coating film 24 is flat. Further, a second organic coating film 25, which is an antireflective film (BARC) containing silicon (Si), is deposited by spin coating in such a way as to cover the upper surface of the first organic coating film 24.

Figure 5:
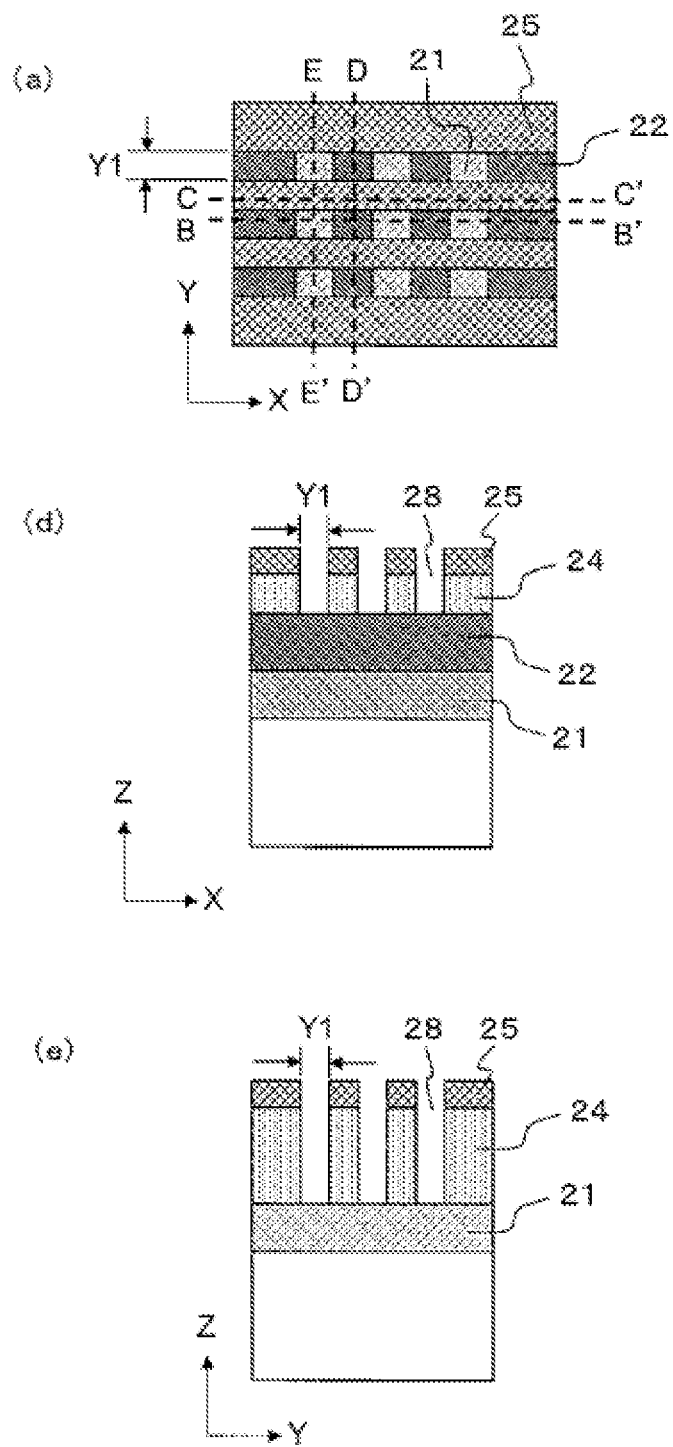
FIG. 5 is a drawing used to describe a method of forming a pattern in the hardmask (a step of forming the first part mask).

Next, with reference to FIG. 5, a photoresist is applied by photolithography in such a way as to cover the second organic coating film 25, after which second opening portions (which are not shown in the drawings) extending in the X-direction are formed in the photoresist. Here, the second opening portions are orthogonal to the first opening portions 23 extending in the Y-direction, and portions of the second organic coating film 25 are exposed at the bottom surfaces thereof.

Next, the exposed second organic coating film 25 and the first organic coating film 24 underlying the exposed second organic coating film 25 are each removed by dry etching to form third opening portions 28, the width Y1 of which in the Y-direction is 40 nm, and which extend in the X-direction. Here, tetrafluoromethane ($CF_4$) is used as the process gas for removing the second organic coating film 25, and a mixed gas comprising nitrogen ($N_2$) and hydrogen ($H_2$) is used as the process gas for removing the first organic coating film 24.

It should be noted that the etching selectivity (referred to hereinafter as selectivity) of the third masking film 22 relative to the first organic coating film 24, and the selectivity of the second masking film 21 relative to the first organic coating film 24 are each at least 50, and therefore portions of the remaining third masking film 22 and portions of the second masking film 21 are exposed at the bottom surfaces of the third opening portions 28.

To describe this in more detail, when seen in a plan view the third masking film 22 remains at the ends, in the X-direction, of the exposed second masking film 21, and similarly the laminated second organic coating film 25 and first organic coating film 24 remain at the ends in the Y-direction.

Next, with reference to FIG. 6, first holes 29 are formed by removing the exposed second masking film 21 by dry etching. Here, tetrafluoromethane ($CF_4$) is used as the process gas for removing the second masking film 21, which is a silicon nitride film, and therefore the second organic coating film 25, comprising BARC containing silicon, which remains on the upper surface of the first organic coating film 24 is removed, but the first organic coating film 24 remains, although its thickness is reduced. Therefore the side surfaces, in the X-direction, of the first holes 29 have a laminated structure comprising the second masking film 21 and the third masking film 22, and similarly the side surfaces in the Y-direction have a laminated structure comprising the second masking film 21 and the first organic coating film 24. Further, portions of the first masking film 20 are exposed at the bottom portions of the first holes 29.

Next, with reference to FIG. 7, the remaining first organic coating film 24 is removed by dry etching. Here, oxygen ($O_2$) is used as the process gas for removing the first organic coating film 24, and therefore the second masking film 21 and the third masking film 22 underlying the first organic coating film 24 that has been removed can be left and exposed.

Further, although a thickness of approximately 20 nm of the first masking film 20 exposed at the bottom surface of the first holes 29 is removed, said first masking film 20 remains, and therefore the first holes 29 become new second holes 30. Here, the side surfaces, in the X-direction, of the second holes 30 have a laminated structure comprising the first masking film 20, having a thickness (depth) of 20 nm, the second masking film 21, having a thickness of 30 nm, and the third masking film 22, having a thickness of 50 nm. However, the side surfaces in the Y-direction have a laminated structure comprising the first masking film 20, having a thickness of 20 nm, and the second masking film 21, having a thickness of 30 nm, and therefore the height Z1 of the side surfaces in the X-direction is 50 nm greater than the height Z2 of the side surfaces in the Y-direction. Further, portions of the remaining first masking film 20 are exposed at the bottom portions of the second holes 30.

Figure 8:
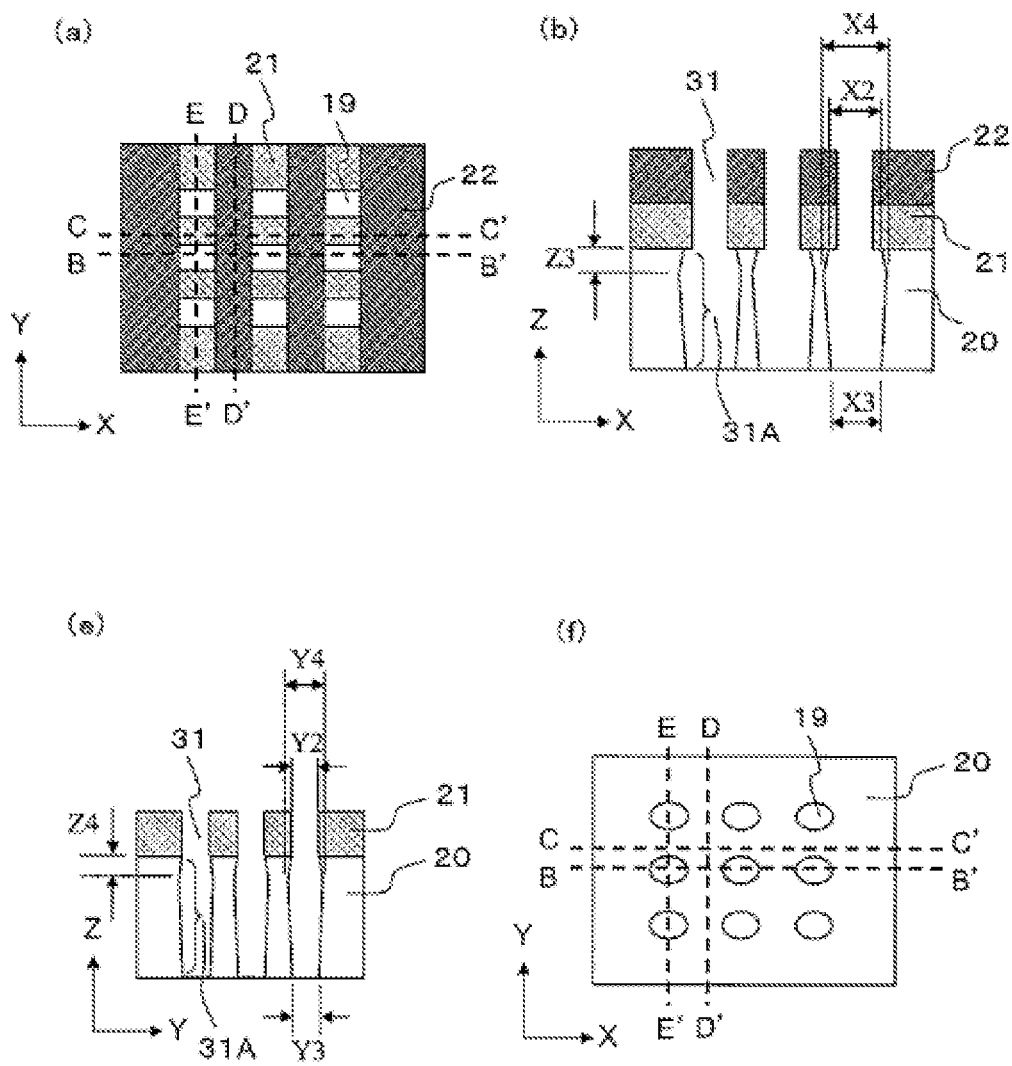
FIG. 8 is a drawing used to describe a method of forming a pattern in the hardmask (a step of forming the hardmask).

Reference is now made to FIG. 8. It should be noted that the step described in FIG. 8 refers to the step of forming the hardmask.

The exposed first masking film 20 is removed by dry etching to form third holes 31. The third holes 31 are formed from the first masking film 20, the second masking film 21 and the third masking film 22, and the portions of the third holes 31 in the first masking film 20 are hereinafter referred to as third holes 31A.

The process conditions for this dry etching are: oxygen ($O_2$) and argon (Ar) as the process gas, flow rates of 100 sccm [Standard Cubic Centimeter per Minute] ($O_2$) and 200 sccm (Ar), a high-frequency power of 500 W, and a pressure of 1.3 Pa. In this dry etching, a charged reaction product is generated when the second masking film 21 is removed, and therefore, using a voltage applied to the silicon substrate 1, the reaction product is electrically attracted from upper parts of the third holes 31 to the side surfaces thereof and is caused to reattach thereto. The reaction product functions as a protective film for the third holes 31A, and the amount of side etching of the third holes 31A can therefore be reduced.

The width, in the X-direction, of the third holes 31A is 50 nm at the upper surface portion (X2), 40 nm at the bottom surface portion (X3), and 70 nm at the maximal portion (X4), and similarly the width in the Y-direction is 40 nm at the upper surface portion (Y2), 30 nm at the bottom surface portion (Y3) and 50 nm at the maximal portion (Y4). As illustrated in FIG. 8 (f), the third holes 31A are elliptical when seen in a plan view, the X-direction of the ellipse being the major diameter, and the Y-direction being the minor diameter. Here, as discussed hereinabove the masking film in the X-direction in the third holes 31 comprises the second masking film 21, having a thickness of 30 nm, and the third masking film 22, having a thickness of 50 nm, and in the Y-direction comprises only the second masking film 21, having a thickness of 30 nm, and therefore the difference between the heights of the masking films in the X-direction and the Y-direction (referred to simply as the height difference hereinafter) is 50 nm.

Thus in the X-direction of the third holes 31A, the masking film (the second masking film 21 and the third masking film 22) is thick, and the distance from the hole opening portion (the upper surface of the third hole 31) is great, and therefore the reaction product mainly reattaches to the masking film and does not reattach within the third hole 31A, whereas in the Y-direction the masking film (the second masking film 21) is thin, and the distance from the hole opening portion is small, and therefore the reaction product reattaches as far as the inner wall of the third hole 31A.

Thus in the X-direction of the third holes 31A the masking film is thick and almost no protective film is formed, and therefore side etching progresses, whereas in the Y-direction the masking film is thin and the protective film covers the inner walls as far as the lower portions thereof, and therefore side etching does not readily occur.

Figure 9:
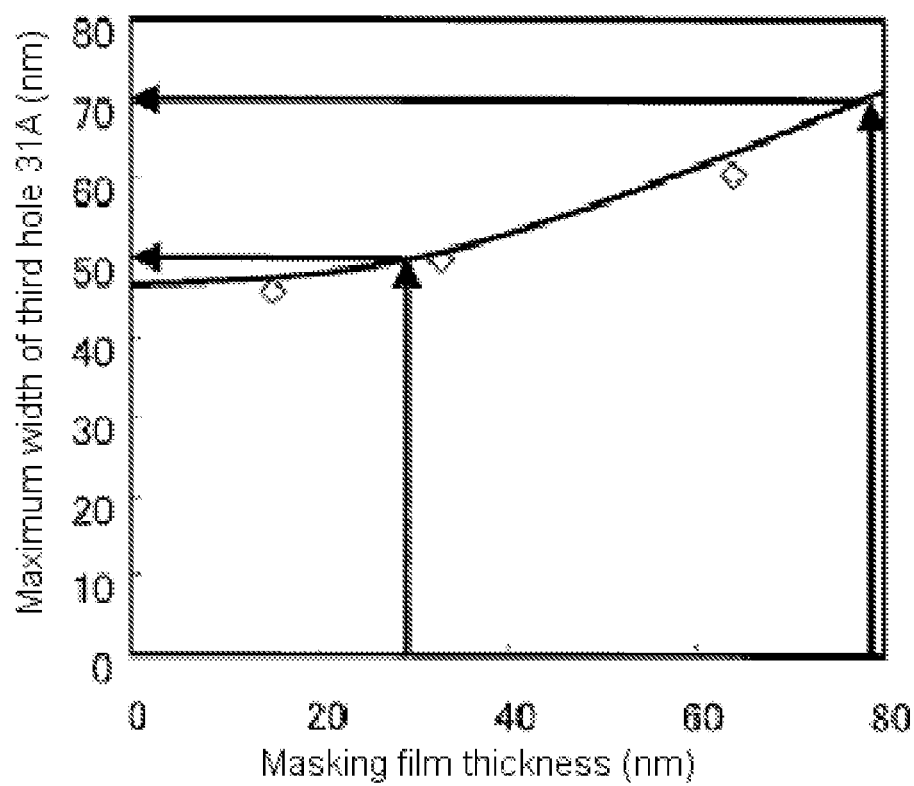
FIG. 9 is a drawing illustrating the correlation between the maximum width of a third hole and the masking film thickness.

It can be seen that the amount of side etching depends on the masking film thickness, by referring to FIG. 9, illustrating the correlation between the maximum width of the third holes 31A and the masking film thickness, which shows that the maximum width increases as the masking film thickness increases. As discussed hereinabove, the reason why the third holes 31A become elliptical is attributable to the fact that the depth to which the reattached reaction product reaches differs between the X-direction and the Y-direction, and thus side etching progresses in the X-direction, thereby forming the major diameter, while side etching does not occur readily in the Y-direction, thereby forming the minor diameter.

The height difference here is 50 nm, but if it is desired to increase the ellipticity, the height difference should be increased further, and if it is desired to reduce the ellipticity in order for the shape to become closer to that of a circle, the height difference should be reduced. It should be noted that the depth Z3 at which the maximal portion in the X-direction occurs is the same depth as the depth Z4 at which the maximal portion in the Y-direction occurs. This is because in the third hole 31A, which is a narrow space, the side etching effect decreases as the distance (depth) from the upper portion which forms the opening portion increases, and therefore the reaction-product film covering the side surfaces in the Y-direction, to the lower portion thereof, is gradually eliminated from the upper portion.

The above steps complete the hardmask 200, and portions of the interlayer insulating film 19 are exposed at the bottom portions of the third holes 31.

In the following description, reference is made not to partial drawings such as those that have been used hereinabove, but to FIG. 10 and FIG. 11, which are general views similar to FIG. 2.

Figure 10:
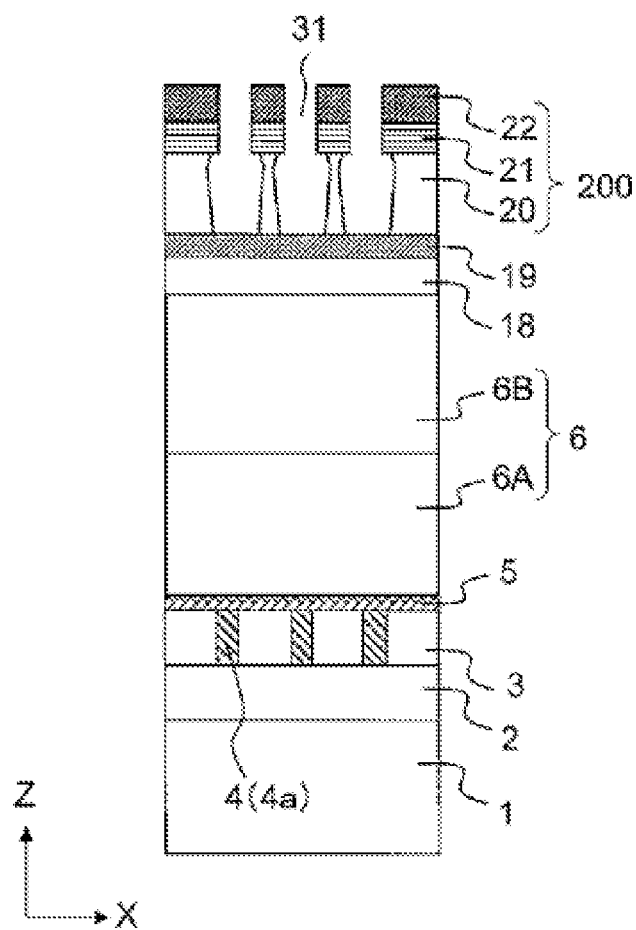
FIG. 10 is a drawing used to describe a method of forming a cylinder hole.

Reference is now made to FIG. 10. The interlayer insulating film 19 exposed at the bottom surface of the third holes 31, and the underlying support film 18, interlayer insulating film 6 (6A, 6B) and stopper film 5 are removed by dry etching using the hardmask 200, to form the high-aspect holes 11. At this time, the third mask 22 and the second masking film 21 are removed simultaneously from the hardmask 200 which served as the etching mask.

Figure 11:
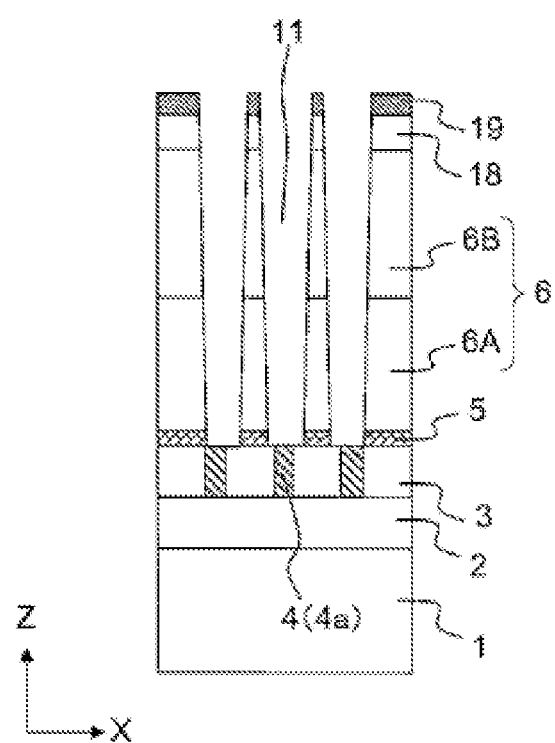
FIG. 11 is a drawing used to describe a method of forming a cylinder hole.

Next, as illustrated in FIG. 11, the remaining first masking film 20 is removed by etching it back, thereby completing the cylinder holes 11, the side surfaces of which are formed from the interlayer insulating film 19, the support film 18, the interlayer insulating film 6 (6A, 6B) and the stopper film 5. It should be noted that at least portions of the upper surfaces of the contact plugs 4 are exposed at the bottom surfaces of the cylinder holes 11.

According to the method of manufacturing a semiconductor device in this mode of embodiment, the hardmask employed when the cylinder holes are formed by dry etching is provided with a height difference. Further, a significant difference between the amounts of side etching in the X-direction and the Y-direction in the cylinder holes is generated by making use of the hardmask height difference to control the area over which the reaction product generated during the subsequent dry etching is reattached, and by this means the cylinder holes can be accurately made to be elliptical.

As discussed hereinabove, one mode of embodiment of the present invention is a method of manufacturing a semiconductor device, comprising: a step of successively forming insulating films (19, 18 and 6) and a first material film (20) on a semiconductor substrate; a step of forming on the first material film a masking film having a rectangular first opening; and a step of dry-etching the first material film using the masking film as a mask to form a mask comprising the first material film in which an elliptical second opening has been formed; wherein the step of forming the masking film comprises a step of forming a second material film (21) having side surfaces that face one another in a first direction of the first opening, and a third material film (21+22) having side surfaces that face one another in a second direction of the first opening, and the thickness of the third material film is greater than the thickness of the second material film.

Further, another mode of embodiment of the present invention is a method of manufacturing a semiconductor device, comprising: a step of successively forming insulating films (19, 18 and 6), a first masking film (20), a second masking film (21) and a third masking film (22) on a semiconductor substrate; a step of forming, on the first masking film, a first opening which is rectangular as seen in a plan view and which has two side surfaces comprising the second masking film, facing one another in a first direction, and two side surfaces comprising the second masking film and the third masking film, facing one another in a second direction perpendicular to the first direction; a step of dry etching the first masking film that is exposed in the first opening, to form in the first masking film a second opening which is elliptical as seen in a plan view; and a step of dry etching the insulating films, using as a mask the first masking film in which the second opening has been formed, to form in the insulating films a hole that is elliptical as seen in a plan view.

According to the method of manufacturing a semiconductor device in the present invention, the thickness of the masking film facing in the second direction is formed in such a way as to be greater than the thickness of the masking film facing in the first direction, and therefore the processed cross-section of the insulating films becomes bowed in the second direction, and becomes wider, while bowing in the first direction is suppressed. In other words, there is no increase in width in the first direction. It is therefore possible to form holes that are elliptical as seen in a plan view, and have a long edge in the second direction and a short edge in the first direction. The reason why it is possible, in this way, to form holes that are elliptical as seen in a plan view, is because use is made of the characteristics of dry etching, whereby the amount of bowing that is generated depends on the thicknesses of the masking films.

Preferred modes of embodiment of the present invention have been described hereinabove, but various modifications to the present invention may be made without deviating from the gist of the present invention, without limitation to the abovementioned modes of embodiment, and it goes without saying that these are also included within the scope of the present invention.

EXPLANATION OF THE REFERENCE NUMBERS

1 Silicon substrate
2 Interlayer insulating film
3 Interlayer insulating film
4 Contact plug
5 Stopper film
6 Interlayer insulating film
7 Lower electrode
8 Capacitative insulating film
9 Upper electrode
10 Capacitor
11 Cylinder hole
12 Interlayer insulating film
13 Contact plug
14 Cylinder hole
15 Contact plug
16 Wiring line
17 Interlayer insulating film
18 Support film
19 Interlayer insulating film
20 First masking film
21 Second masking film
22 Third masking film
23 First opening portion
24 First organic coating film
25 Second organic coating film
28 Third opening portion
29 First hole
30 Second hole
31 Third hole
200 Hardmask

What is claimed is:

1. A method of manufacturing a semiconductor device, comprising:
successively forming an insulating film and a first material film on a semiconductor substrate;
forming on the first material film a masking film having a rectangular first opening; and
dry-etching the first material film using the masking film as a mask to form, in the first material film, an elliptical second opening having a short edge in a first direction;
wherein forming the masking film comprises forming a second material film having side surfaces that face one another in a first direction of the first opening, and a third material film having side surfaces that face one another in a second direction of the first opening, and the thickness of the third material film is greater than the thickness of the second material film.

2. The method of claim 1, wherein by causing a reaction product generated through the dry etching of the first material film to reattach to the side surfaces of the second opening, the reaction product is made to function as a protective film for the second opening.

3. The method of claim 2, wherein by making the reaction product function as a protective film for the second opening, the amount of side-etching resulting from side-etching of the second opening can be reduced.

4. The method of claim 2, wherein the reaction product is caused to reattach to the side surfaces of the second opening by being electrically attracted from an upper part of the second opening to the side surfaces thereof, using a voltage applied to the semiconductor substrate.

5. The method of claim 3, wherein the second opening is formed as the ellipse because in the second direction the side etching progresses, thereby forming a major diameter, and in the first direction the side etching does not progress readily, thereby forming a minor diameter.

6. The method of claim 1, wherein the ellipticity of the second opening increases by increasing the difference between the thickness of the third material film and the thickness of the second material film, and the ellipticity of the second opening decreases by reducing the difference between the thicknesses.

7. The method of claim 1, wherein the insulating film comprises at least a stopper film, a first interlayer insulating film formed on the stopper film, a support film formed on the first interlayer insulating film, and a second interlayer insulating film formed on the support film.

8. The method of claim 7, wherein the first material film is an amorphous carbon film formed by plasma CVD in such a way as to cover the upper surface of the second interlayer insulating film.

9. The method of claim 8, wherein the second material film is a silicon nitride film formed on the first material film by plasma CVD.

10. The method of claim 8, wherein the third material film comprises at least a silicon dioxide film formed on the first material film by plasma CVD.

11. The method of claim 10, wherein the third material film is formed from a laminated structure comprising the silicon nitride film and the silicon dioxide film.

12. A method of manufacturing a semiconductor device, comprising:
successively forming an insulating film, a first masking film, a second masking film and a third masking film on a semiconductor substrate;
forming, on the first masking film, a first opening which is rectangular as seen in a plan view and which has two side surfaces comprising the second masking film, facing one another in a first direction, and two side surfaces comprising the second masking film and the third masking film, facing one another in a second direction perpendicular to the first direction;
dry etching the first masking film that is exposed in the first opening, to form in the first masking film a second opening which is elliptical as seen in a plan view; and
dry etching the insulating film, using as a mask the first masking film in which the second opening has been formed, to form in the insulating film a hole that is elliptical as seen in a plan view.

13. The method of claim 12, wherein by causing a reaction product generated through the dry etching of the first masking film to reattach to the side surfaces of the second opening, the reaction product is made to function as a protective film for the second opening.

14. The method of claim 13, wherein by making the reaction product function as a protective film for the second opening, the amount of side-etching resulting from side-etching of the second opening can be reduced.

15. The method of claim 13, wherein the reaction product is caused to reattach to the side surfaces of the second opening by being electrically attracted from an upper part of the second opening to the side surfaces thereof, using a voltage applied to the semiconductor substrate.

16. The method of claim 14, wherein the second opening is formed as the ellipse as seen in a plan view because in the second direction the side etching progresses, thereby forming a major diameter, and in the first direction the side etching does not progress readily, thereby forming a minor diameter.

17. The method of claim 12, wherein the height of the two side surfaces comprising the second masking film and the third masking film, facing one another in the second direction, is greater than the height of the two side surfaces comprising the second masking film, facing one another in the first direction.

18. The method of claim 17, wherein the ellipticity of the second opening increases by increasing the difference between the height of the two side surfaces comprising the second masking film and the third masking film and the height of the two side surfaces comprising the second masking film, and the ellipticity of the second opening decreases by reducing the difference between the heights.

19. The method of claim 12, wherein the insulating film comprises at least a stopper film, a first interlayer insulating film formed on the stopper film, a support film formed on the first interlayer insulating film, and a second interlayer insulating film formed on the support film.

20. The method of claim 19, wherein the first masking film is an amorphous carbon film formed by plasma CVD in such a way as to cover the upper surface of the second interlayer insulating film.

21. The method of claim 20, wherein the second masking film is a silicon nitride film formed on the first masking film by plasma CVD.

22. The method of claim 20, wherein the third masking film is a silicon dioxide film formed on the second masking film by plasma CVD.

* * * * *